US00H002069H

(19) United States

(12) Statutory Invention Registration (10) Reg. No.: US H2069 H

Rieger et al. (43) Published: Jul. 1, 2003

(54) SIGNAL PROCESSOR

(75) Inventors: James L. Rieger, Ridgecrest, CA (US); Paul H. Woodworth, Ridgecrest, CA (US)

(73) Assignee: The United States of America as represented by the Secretary of the Navy, Washington, DC (US)

(21) Appl. No.: 06/700,999

(22) Filed: Dec. 21, 1984

(51) Int. Cl.[7] ..... H03L 7/00

(52) U.S. Cl. ..... 331/1 A; 331/1 R

(58) Field of Search ..... 331/1 A, 1 R; 178/22.17

(56) References Cited

U.S. PATENT DOCUMENTS

| | | | | | |
|---|---|---|---|---|---|
| 3,614,649 | A | * | 10/1971 | Gerig | 331/1 R |
| 3,659,046 | A | | 4/1972 | Angeleri et al. | 178/22.17 |
| 3,908,115 | A | | 9/1975 | Waggener | 235/152 |
| 3,950,616 | A | * | 4/1976 | Tammaru | 178/22.17 X |
| 4,054,838 | A | | 10/1977 | Tretter | 325/323 |
| 4,085,288 | A | * | 4/1978 | Viswanathan | 331/1 A X |
| 4,179,657 | A | | 12/1979 | Hobbs | 325/33 |
| 4,215,245 | A | | 7/1980 | Bellisio | 370/84 |
| 4,339,823 | A | | 7/1982 | Predina et al. | 375/20 |
| 4,496,912 | A | * | 1/1985 | Ritter | 331/1 A |

* cited by examiner

*Primary Examiner*—Daniel T. Pihulic

(74) *Attorney, Agent, or Firm*—William C. Townsend; W. Thom Skeer

(57) ABSTRACT

A signal processor circuit has a phase-locked loop with a low-pass filter for removing phase-modulation components from a clock signal. The processor circuit has an isolated power supply for removing amplitude-modulation components from the same clock signal.

7 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SIGNAL PROCESSOR

BACKGROUND OF THE INVENTION

1. Field of the Invention

This device relates to signal processing and more particularly the processing of clock signals. Even more particularly this device pertains to processing a clock signal so as to remove the original amplitude- and phase-modulation components from the clock signal.

2. Description of the Prior Art

Various approaches are available for deriving a "clean" clock signal from a noisy signal. One approach uses an adaptively tuned data receiver for reconstructing a noisy digital signal by using a matched filter which is tunable. The tuning is set by a timing signal which represents the true rate of the received signal. Another approach discloses a system for correcting phase jitter and frequency offsets by using a phase-locked loop for tracking the average phase and frequency offsets followed by a phase jitter corrector located outside the loop. Still another approach is to use an isolated clock circuit for generating the clock signal to be encoded for transmitting signals. The isolated clock is run on an isolated supply and buffers are used to isolate paths going to the multiplexer and the encryptor.

All the above-mentioned approaches contain an efficient means for effective removal of amplitude- and phase-modulation components. The reconstruction of a noisy signal may eliminate phase-modulation components but not necessarily amplitude modulation components. Similarly, the system for correcting phase jitter and frequency offsets by using a phase-locked loop together with a jitter corrector may remove phase-modulation components but not necessarily amplitude-modulation components. The approach utilizing an isolated clock and associated circuits is cumbersome. Further the external clock does not have the advantages of the multiplexer's internal clock which are better noise performance and desired synchrony since the multiplexer power supply oscillator is usually synchronous with the internal clock. Approaches utilizing external power supplies and amplitude buffers alone do not remove phase noise.

SUMMARY OF THE INVENTION

The shortcomings of prior art devices include the lack of removal of both amplitude- and phase-modulation components from the clock signal, lack of synchronism in the output signal with the multiplexer internal clock, lack of simplicity of the main and associated circuits, required circuit modification, and notable expense. The present device avoids these shortcomings.

The present signal processor utilizes a simple design for effectively removing both amplitude- and phase-modulation components from a clock signal. The signal processor is quite useful in enhancing electromagnetic isolation of encrypting/decrypting equipment for secure telemetry. Removal of amplitude- and phase-modulation components from the clock line is necessary to securely operate an encryptor for digital data. A signal encrypted with a dirty clock-signal would be decodeable from the jitter introduced.

The device takes the unregulated clock pulses through a phase-locked loop with a low-pass filter in the feedback loop having a frequency of about one-tenth of the incoming clock frequency. Buffers on the device's output provide a proper interface with output clock application circuitry. The complete device including the buffers is powered by a regulated power source independent of external circuitry such as clock sources and destinations.

The phase-locked loop of the device follows the average frequency and the phase of the signal and, in doing so, any phase modulation on the input clock signal is reduced or masked or both. This reduction or masking of phase noise is important. In the case of an encrypted telemetry signal, the phase noise is generated in the area of the signal to be enciphered and is an undesired by-product since phase detection of this jitter can reveal significant information even though the signal itself has been enciphered. The use of a phase-locked loop as designed in the present device removes this type of data contamination.

Amplitude variations of an encrypted telemetry signal pose the same threat of revelation of information on the encrypted signal. These amplitude variations are removed by regeneration of the signal within a digital domain established by an amplifier operated off a regulated power supply which is also part of the present system.

Besides the object of this device's removing both amplitude and phase-modulation components which can reveal information from a clock signal which has already been encrypted, another object is the simplicity of the circuitry which eliminates cumbersome associated circuits such as an outboard oscillator with an external power supply to implement the same functional advantages of the present device.

Still another object is the relatively low expense of the device compared to other approaches for accomplishing the same purpose.

Other objects and novel features of the invention will become apparent from the following detailed description of the invention.

BRIEF DESCRIPTION OF THE DRAWING

Further objects and advantages will become obvious to the person of ordinary skill when the following description of the preferred embodiments is studied in conjunction with the accompanying drawing figures wherein.

DESCRIPTION OF THE SPECIFIC EMBODIMENTS

Figure 1:
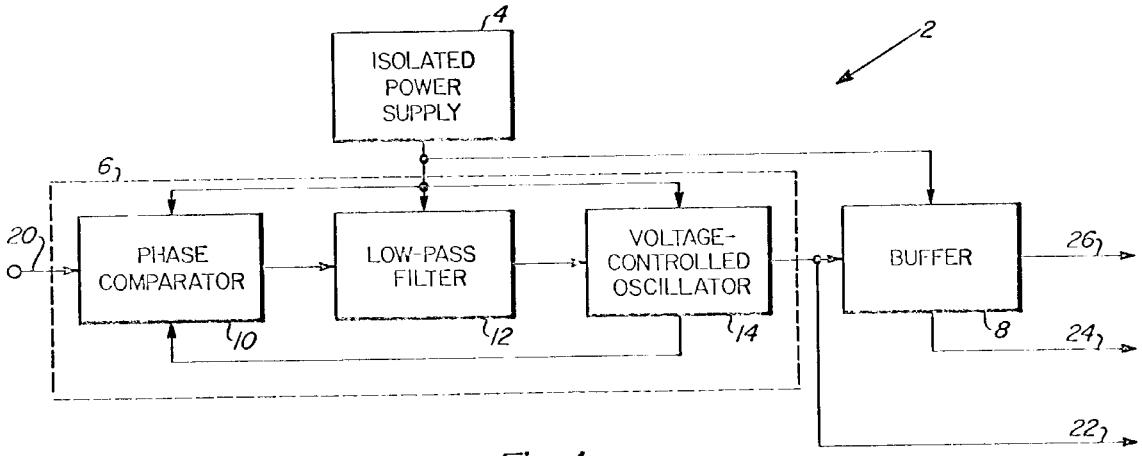
FIG. 1 is a block diagram of the invention.

FIG. 1 shows a block diagram for signal processor 2. Signal processor 2 consists of two basic components which are an isolated power supply 4 and a phase-locked loop 6. The phase-locked loop is a closed loop electronic servomechanism in which the output locks onto and tracks a reference signal. A phase lock is accomplished by comparing the phases of the output signal or a multitude or fraction of-it and the reference signal. Any phase difference between these two signals is converted into a correction voltage that causes the phase of the output signal of the phase-locked loop to change so that it tracks the reference. Within the phase-locked loop 6 the phase difference between the signals going in and coming out of phase-locked loop 6 is detected by a phase comparator 10. The input signal which in this particular application is a so-called dirty clock which comes in on input 20. The output of the phase comparator 10 goes into a low-pass filter 12. The low-pass filter 12 results in the feedback loop frequency of about 1/10 of the operating frequency. The output of the low-pass filter is fed into a voltage-controlled oscillator. The output is a voltage which affects the frequency coming out of the voltage-controlled oscillator 14. The feedback from the voltage-controlled oscillator 14 goes back into the phase comparator 10, which is the signal-compared to the input signal 20. The output of the phase-locked loop 6 comes out of voltage-controlled oscillator 14. The purpose of the phase-locked loop is to remove phase fluctuations of the clock signal coming in on input 20 and it introduces some phase shifts as a mask which results on the output of phase-locked loop 6. The output of phase-locked loop 6 may be an unbuffered output coming out on output 22. Output 24 is a buffered inverted output and output 26 is a buffered noninverted output from buffer 8. All components of signal processor 2 are powered by or receive their voltage source from isolated power supply 4. Output of isolated power supply 4 goes to phase comparator 10, low-pass filter 12, as needed, voltage control oscillator 14 and buffer 8. Isolated power supply 4 is a regulated voltage independent of any voltage or source driving the clock signal which comes in on input 20. The purpose of isolated power supply is to remove the amplitude fluctuations of clock signal on input 20. Isolated power supply 4 is strictly an independent supply just for signal processor 2 exclusively.

Figure 2:
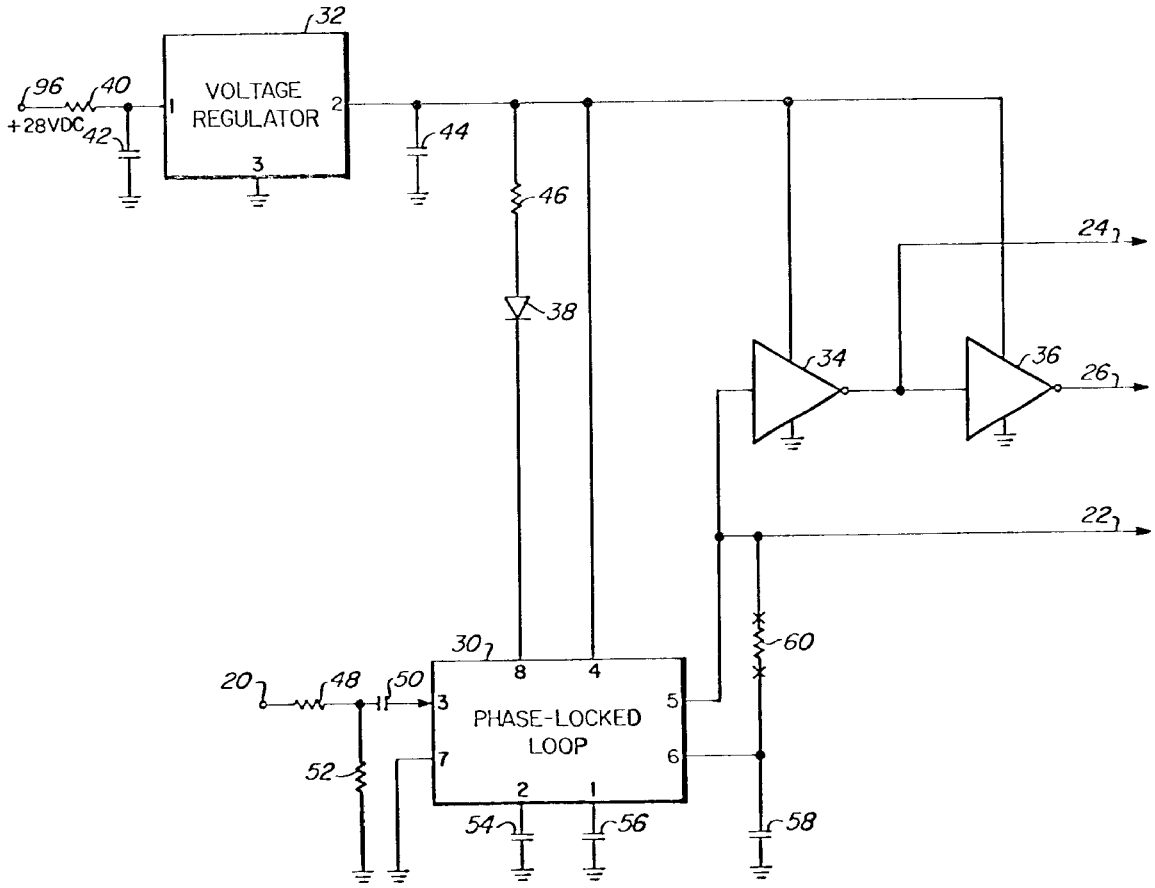
FIG. 2 is a schematic of an embodiment of the invention.

FIG. 2 is a detailed embodiment in terms of specific parts of the signal processor 2. A signal comes in on input 20. The input signal goes through resistor 48 which is 10,000 ohms and is fed on through a 0.01 microfarad capacitor. Connected to a point between resistor 48 and capacitor 50 is resistor 52 which is tied at the other end to ground. Resistor 52 is a value of 1,000 ohms. The input signal that goes through capacitor 50 goes on to pin 3 of integrated circuit 30. Integrated circuit 30 is a Signetics 567 type integrated circuit. This integrated circuit is a phase-locked loop. Pin 7 of integrated circuit 30 is grounded. Pin 1 of integrated circuit 30 is connected to capacitor 56. The other side of capacitor 56 is connected to ground. Capacitor 56 is a value of 1,000 picofarads. Pin 2 of integrated circuit 30 is connected to capacitor 54. The other side of capacitor 54 is connected to ground. The value of capacitor 54 is 500 picofarads. Pin 5 of integrated circuit 30 is the unbuffered output 22. Pin 6 of integrated circuit 30 is connected to capacitor 58. The other terminal of capacitor 58 is connected to ground. Capacitor 58 has a value of 1,800 picofarads. Pin 6 is also connected to resistor 60. The other terminal of resistor 60 is connected to pin 5 of integrated circuit 30. Resistor 60 is such that it may be replaced with various values of resistors depending on the desired kilobit rate. For 300,000 hertz resistor 6 is approximately 2,000 ohms. Also pin 5 is connected to input of a buffer 34. Buffer 34 is an inverting buffer. The output of buffer 34 is output 24 which is the buffered inverting output. Also output of buffer 34 goes to buffer 36 which is an inverting buffer. From buffer 36 is the buffered noninverting output 26. Buffers 34 and 36 may be an RCA CD4009UB or CD4049UB type integrated circuit. Buffers 34 and 36 may also be a Texas Instruments type 74S140 integrated circuit for 75 ohm drive capability. Integrated circuit 32 is a 5 volt voltage regulator. Integrated circuit 32 may be a Fairchild $\mu$A7805 integrated circuit or a National Semiconductor 78L05 or a National Semiconductor LM309 integrated circuit or other similar regulator. The 5 volt regulator is needed for the amplitude buffering of the input clock signal at input 20. Pin 1 of integrated circuit 32 is connected to capacitor 42. The other terminal of capacitor 42 is connected to ground. Capacitor 42 is an electrolytic capacitor of 15 microfarads and has a 15 volt rating. Pin 1 of integrated circuit 32 is also connected to resistor 40. The other terminal of resistor 40 is connected to a +28 volts. Resistor 40 is 1,000 ohms and has a rating of 3 watts. Pin 3 of integrated circuit 32 is connected to ground. Pin 2 of integrated circuit 32 is the output and is connected to capacitor 44. The other terminal of capacitor 44 is connected to ground. Capacitor 44 has a value of 0.1 microfarad. Pin 2 is also connected to resistor 46. Resistor 46 has a value of 180 ohms. The other terminal of resistor 46 is connected to a light-emitting diode 38. The other terminal of the light-emitting diode 38 is connected to pin 8 of integrated circuit 30. The light-emitting diode indicates when the circuit is operating and locked to the input. The light-emitting diode 38 and resistor 46 may be deleted for power saving if the feature is not desired. The regulated voltage output of integrated circuit 32 is also connected to pin 4 of integrated circuit 30. The output of integrated circuit 32 provides a regulated voltage supply for buffers 34 and 36. The grounding terminals of buffers 34 and 36 are connected to a common ground.

Figure 3:
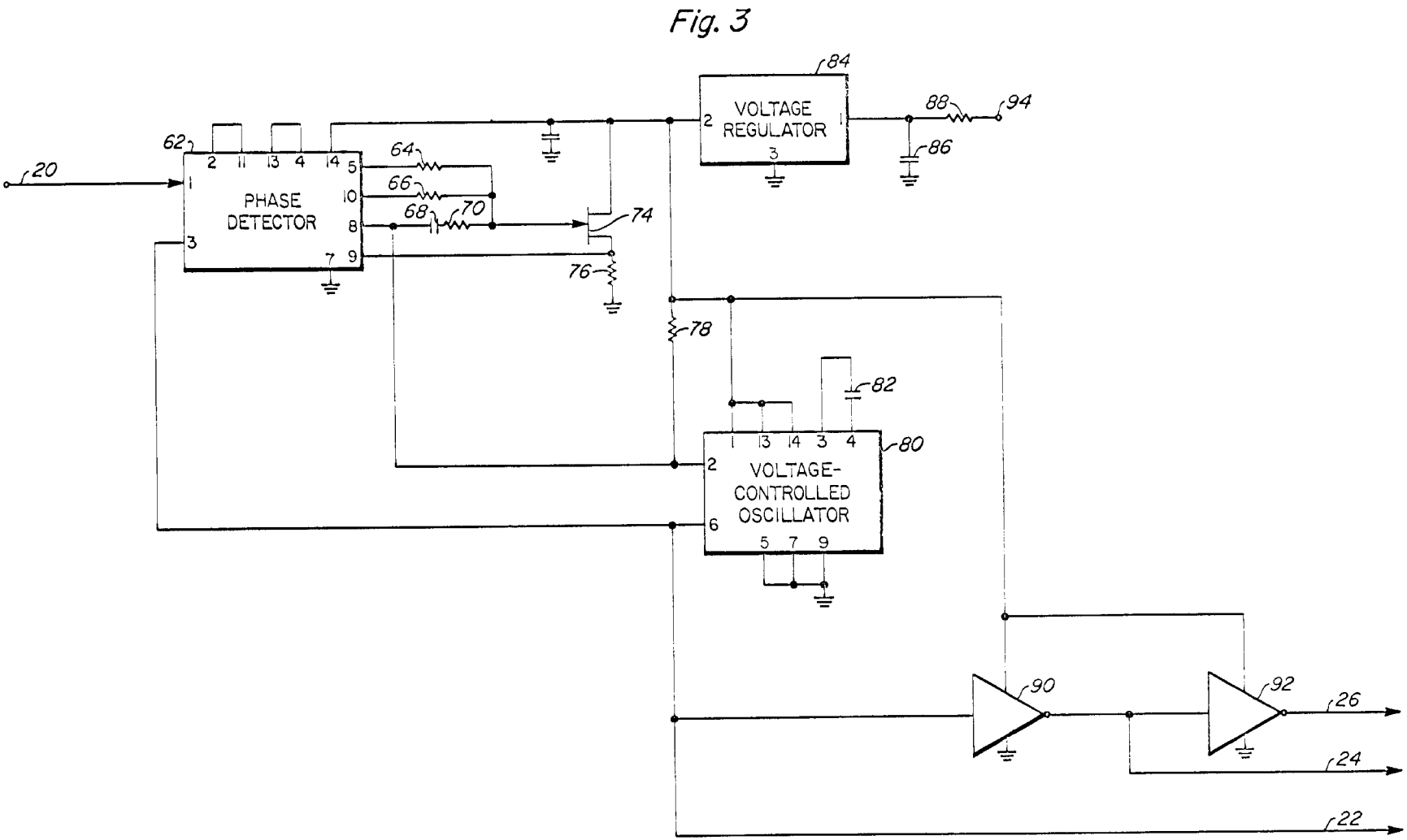
FIG. 3 is a schematic of another embodiment of the invention.

FIG. 3 shows another specific embodiment of signal processor 2. The specific embodiment in FIG. 2 is simpler to build than the one in FIG. 3. However, the specific embodiment in FIG. 3 has a faster loop lock-up than the embodiment of FIG. 2. The lock-up period of time is about 0.1 second or so and the lock-up time on the embodiment in FIG. 3 is generally no more than one millisecond. The input which is a clock signal to input 20 goes to pin 1 of integrated circuit 62. Integrated circuit 62 is a phase detector or comparator. Integrated circuit 62 may be an MC4044 or a 74444 type integrated circuit. Pins 2 and 11 of integrated circuit 62 are connected to each other electrically with for example a jumper wire. Pins 13 and 4 also are connected to each other electrically with for example a jumper wire. Pin 14 of integrated circuit 62 is the regulated voltage input. Pin 14 is connected to capacitor 72 and the other terminal of capacitor 72 is connected to ground. Capacitor 72 has a value of 0.1 microfarad. Pin 14 is connected to the output pin number 2 of integrated circuit 84. Integrated circuit 84 is a basic 5 volt regulator capable of a 100 milliamp current output. The integrated circuit 84 may be a Fairchild $\mu$A7805 or a National Semiconductor 78L05 or a National Semiconductor LM309 type integrated circuit or other 5 volt regulator. Pin 3 of integrated circuit 84 is connected to ground. Pin 1 of integrated circuit 84 is connected to resistor 88 and the other terminal of resistor 88 is connected to a +28 volt supply 94. Pin 1 of integrated circuit 84 is also connected to capacitor 86. The other terminal of capacitor 86 is connected to ground. Capacitor 86 has a value of 15 microfarads and is rated at 50 volts. It is an electrolytic capacitor. Pin 7 of integrated circuit 62 is connected to ground. Pin 5 of integrated circuit 62 is connected to ground. Pin 5 of integrated circuit 62 is connected to resistor 64. Resistor 64 has a value of 680 ohms. Pin 10 of integrated circuit 62 is connected to resistor 66. Resistor 66 has a value of 680 ohms. The other ends of resistor 64 and 66 are connected together. Those connected ends are connected to a gate of field effect transistor 74. Field effect transistor 74 may be a 2N3819 type transistor. Pin 8 of integrated circuit 62 is connected to capacitor 68. Capacitor 68 is of a variable value. The value of capacitor 68 sets the low-frequency rolloff corner but it does not affect the frequency. The other end of capacitor 68 is connected to resistor 70. Resistor 70 has a value of 6,8000 ohms. The other end of resistor 70 is connected to the gate of the field effect transistor 74. Pin 9 is connected to the other side of the field effect transistor opposite from the power supply side. Also connected to pin 9 is resistor 76. Resistor 76 has a value of 150 ohms. The other terminal of resistor 76 is connected to ground. Integrated circuit 80 is a voltage-controlled multivibrator or oscillator. Integrated circuit 80 may be an MC4024 or 74424 type of circuit. The output from pin 8 of integrated circuit 62 is connected to the input pin 2 of integrated circuit 80. The output of integrated circuit 80, pin 6, is connected back in a feedback loop to pin 3 of integrated circuit 62. Also the output of pin 6 of integrated circuit 80 is the unbuffered output 22. Capacitor 82 is hooked or connected to pins 3 and 4 of integrated circuit 80. Capacitor 82 is inversely proportional to frequency up to more than 10 megabits per second. The component values in general are selected for 100 kbits per second. Pins 5, 7 and 9 of integrated circuit 80 are connected to ground. The regulated voltage output of pin 2 of integrated circuit 84 is connected to pins 1, 13 and 14 of integrated circuit 80. Connected to pin 2 of integrated circuit 84 is resistor 78. The other terminal of resistor 78 is connected to the input pin 2 of integrated circuit 80. Resistor 78 has a value of 1,000 ohms. The output of integrated circuit 84 provides a regulated voltage supply to buffers 90 and 92. Buffers 90 and 92 are inverting output buffers. Buffers 90 and 92 may be an integrated circuit such as an RCA CD4009UB or CD4049UB. Buffers 90 and 92 may instead be a Texas Instrument 74S140 type integrated circuit for 75 ohm drive capability. The output of buffer 90 is a buffered, inverted output 24. The output of buffer 92 is a buffered, noninverted output 26.

All of the above mentioned circuit elements used in either embodiment and their corresponding schematics and technical information may be obtained from American Micro Semiconductor in Madison, N.J.

Obviously many modifications and variations, including utilizations of different parts, of the present invention are possible in light of the above teachings. It is therefore to be understood that within the scope of the appended claims the invention may be practiced otherwise than as specifically described.

What is claimed is:

1. A signal processor circuit for producing a clock signal for encrypted telemetry by using an existing clock having an incoming clock operating frequency, the circuit comprising:

an input of unregulated clock pulses;

a phase locked loop having a feedback loop connected to said clock signal input;

a low pass filter in said feedback loop having a frequency of one-tenth the operating frequency;

an isolated power supply independent of said clock signal and connected to said phase locked loop for supplying power therefor.

2. A signal processor for removing amplitude- and phase-modulation components from a clock signal, according to claim 1, further comprising a buffer connected to said phase-locked loop and to said isolated power supply.

3. A signal processor for removing amplitude- and phase-modulation components from a clock signal, according to claim 1, further comprising:

a first inverting buffer connected to said phase-locked loop and to said isolated power supply; and a second inverting buffer connected to said first inverting buffer and to said isolated power supply.

4. A signal processor for removing amplitude- and phase-modulation components from a clock signal, according to claim 1, wherein said phase-locked loop comprises:

a phase comparator effectively connected to said isolated power supply;

said low-pass filter effectively connected to said isolated power supply and to said phase comparator; and a voltage-controlled oscillator effectively connected to said isolated power supply, to said low-pass filter, and to said phase comparator.

5. A signal processor for removing amplitude- and phase-modulation components from a clock signal, according to claim 4, further comprising a buffer connected to said voltage-controlled oscillator and to said isolated power supply.

6. A signal processor for removing amplitude- and phase-modulation components from a clock signal, according to claim 5, further comprising:

a first inverting buffer connected to said voltage-controlled oscillator and to said isolated power supply; and a second inverting buffer connected to said first inverting buffer and to said isolated power supply.

7. A signal processor for removing amplitude- and phase-modulation components from a clock signal, comprising:

an isolated power supply independent of said clock signal a phase comparator connected to said isolated power supply;

a low-pass filter connected to said phase comparator and effectively connected to said isolated power supply; and voltage-controlled oscillator connected to said low-pass filter, to said phase comparator and to said isolated power supply; and at least one buffer effectively connected to said voltage-controlled oscillator and to said isolated power supply.

* * * * *